Figure 1:
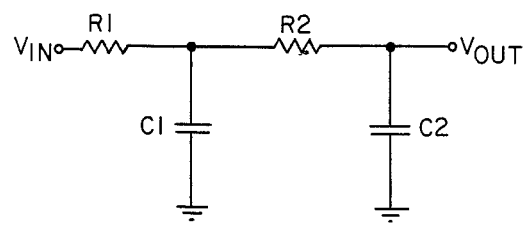

United States Patent [19]

Sevastopoulos

[11] Patent Number: 4,783,635

[45] Date of Patent: Nov. 8, 1988

[54] LOW PASS FILTER CIRCUIT

[75] Inventor: Nello Sevastopoulos, San Jose, Calif.

[73] Assignee: Linear Technology Corporation, Milpitas, Calif.

[21] Appl. No.: 909,973

[22] Filed: Sep. 22, 1986

[51] Int. Cl.$^4$ .............................................. H03F 1/34
[52] U.S. Cl. .................................. 330/107; 307/520; 328/167; 330/306
[58] Field of Search ............... 330/107, 109, 294, 303, 330/306; 307/520; 328/167; 333/172

[56] References Cited

U.S. PATENT DOCUMENTS

| T904,030 | 11/1972 | Davie | 330/294 X |
| 3,701,952 | 10/1972 | Miller et al. | 330/107 UX |
| 4,122,398 | 10/1978 | Dunn | 330/107 |

FOREIGN PATENT DOCUMENTS 1283411 11/1968 Fed. Rep. of Germany ...... 330/306

OTHER PUBLICATIONS

Geffe, "RC-Amplifier Resonators for Active Filters", IEEE Transactions on Circuit Theory, vol.-CT-15, No. 4, Dec. 1968, pp. 415-419.

Primary Examiner—James B. Mullins
Attorney, Agent, or Firm—Flehr, Hohbach, Test, Albritton & Herbert

[57] ABSTRACT

A low pass filter circuit for filtering out high frequency AC components from an electric signal including a DC component and possibly low frequency AC components is disclosed herein. This circuit includes a first order, low pass RC filter network, free of any active elements, for receiving a signal at an input and passing the entire DC component and any low frequency AC components present in the signal to an output. The circuit also includes circuitry utilizing at least some active components and a predetermined transfer function for filtering out high frequency components in the signal over a predetermined, relatively narrow roll-off frequency band. This latter circuitry cooperates with the RC network so that the operation of its active elements does not act on the DC component of the signal and therefore does not affect the amplitude of the DC component as it appears at the output.

4 Claims, 2 Drawing Sheets

LOW PASS FILTER CIRCUIT

The present invention relates generally to a low pass filter circuit for filtering out high frequency AC components from an electric signal including DC and AC components, and more particularly to a low pass filter which is highly DC accurate and which is capable of filtering out high frequency AC components over a predetermined, relatively narrow roll-off frequency band.

One of the simplest types of low pass filter circuits known in the prior art is a first or second order RC network. A first order RC network consists of a single resistor and capacitor connected between an input terminal and an output terminal. A second order RC network consists of two such resistors and two such capacitors between the input and output terminals, as specifically illustrated in FIG. 1. This type of low pass filter circuit is highly DC accurate. That is, this type of circuit, which includes no active elements, does not act upon the DC component except to pass it from the input terminal to the output terminal. This is best illustrated in FIG. 2 by means of the solid line curve which graphically illustrates output voltage on the vertical axis as a function of frequency on the horizontal axis for a pure RC filter circuit of the type illustrated in FIG. 1.

Figure 2:
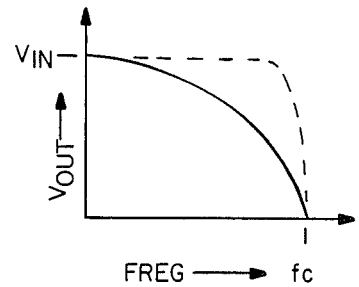

Note that the DC component (frequency=0) at the output terminal in the graph of FIG. 2 is equal to the DC component at the input terminal. However, it can also be seen from this graphic illustration that the voltage begins to taper off immediately with frequency and tapers off relatively gradually before it reaches its ultimate cut off frequency $F_c$. By definition $F_c$ is the frequency at which the input voltage is attenuated by 3 decibels or $V_{out}=V_{i4}/\sqrt{2}$ (see FIG. 2 correction). Stated another way, the pure RC network filters out its high frequency components over a relatively wide roll-off band or stated still another way this type of circuit displays a relatively gradual roll-off. This is to be contrasted with an ideal low pass filter which is exemplified graphically in FIG. 2 by means of the dotted line curve. As seen there, the ideal low pass filter maintains the output voltage equal to the input voltage throughout a low frequency band between zero frequency and a particular selected cut off frequency, whereupon the input voltage (at and above the cut off frequency) drops to zero.

Figure 3:
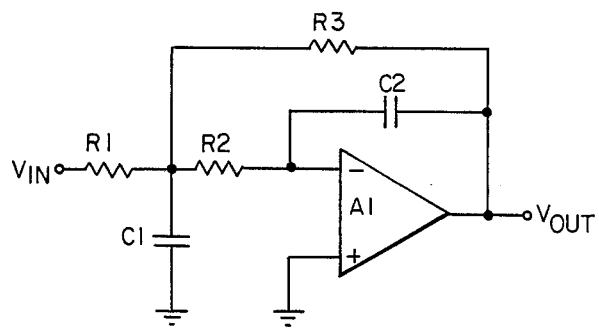

In an attempt to improve upon the roll-off capabilities of a low pass filter circuit, there have been proposals which combine a pure RC network with circuitry including active components. One such circuit is illustrated in FIG. 3. The RC network consists of resistors $R_1$, $R_2$, $R_3$ and capacitors $C_1$, $C_2$. The rest of the circuit which forms the active circuit arrangement consists of an operational amplifier $A_1$. The active circuit arrangement cooperates with the RC network to improve filter roll-off, as exemplified in FIG. 4 which, like FIG. 2, graphically illustrated frequency as a function of output voltage. Note that the solid line curve is flatter at the top than the solid line curve in FIG. 2 which means that the filter of FIG. 3 can have a gain of 1 for input signals which frequency is more than zero. However, the low pass filter circuit illustrated in FIG. 3 is not DC accurate. That is, its output at zero frequency may be equal to the DC component of the input or it may be greater than or less than the DC component, as illustrated by the dotted lines in FIG. 4. This is because the DC path goes through the active elements of the circuit, specifically the operational amplifier $A_1$. In the particular circuit illustrated in FIG. 3, that path comprises the resistors $R_1$ and $R_3$, which includes the feedback loop of the operational amplifier. The latter tries to compensate for the DC component and, in doing so, it introduces an error into the DC component of the output.

In view of the foregoing, it is an object of the present invention to provide a low pass filter circuit which is highly DC accurate but which at the same time displays a relatively rapid filter roll-off rate at high frequencies, as compared to pure RC low pass filters.

A more particular object of the present invention is to provide a low pass filter circuit which is capable of passing DC and low frequency AC components of a signal at constant amplitude while, at the same time, filtering out the high frequency components over a relatively narrow frequency roll-off band, specifically over a fifth roll-off band in an actual embodiment.

A further object of the present invention is to provide a low pass filter circuit which utilizes active components have no affect on the DC component of the signal being filtered.

Still a further object of the present invention is to provide a low pass filter circuit of the last mentioned type in which the active components utilized form part of a circuit arrangement which is isolated both at its input and it output from the DC component of the signal being filtered, whereby the DC component amplitude can be substantially greater than the ratings of the elements making up the active circuitry without damaging these latter elements.

As will be seen hereinafter, the low pass filter circuit disclosed herein includes an input, an output and first and second circuit means. In accordance with one feature of the present invention, the first circuit means which is free of any active elements receives the signal to be filtered at its input and passes the entire DC component and low frequency AC components if present, to the output. The second circuit means is connected to the first circuit means and includes at least some active components acting on the signal for preventing high frequency components of the signal from reaching the output. At the same time, the second circuit means cooperates with the first circuit means so that the operation of its active elements does not act on the DC component of the signal and therefore does not effect the amplitude of the DC component of the signal as it appears at the output. In other words, in accordance with this feature of the invention, the overall low pass filter circuit is highly DC accurate even though it includes active elements. In accordance with a second feature of the present invention, the second circuit means, that is the circuitry including the active elements, includes means defining a predetermined transfer function for filtering out high frequency components over a predetermined high frequency band at a relatively high order roll-off rate. In an actual working embodiment this latter circuitry including specifically its transfer function is selected to obtain fifth order "maximally flat" roll-off capabilities.

Figure 4:
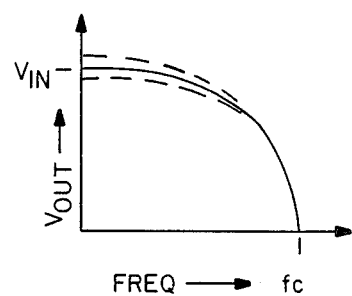
Figure 5:
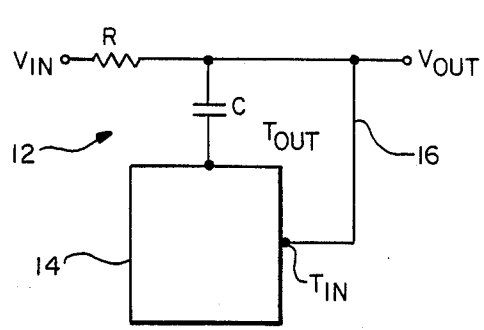
Figure 6:
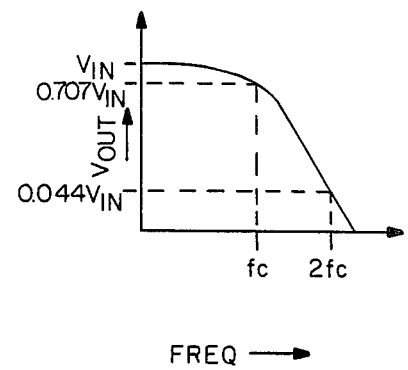
Figure 7:
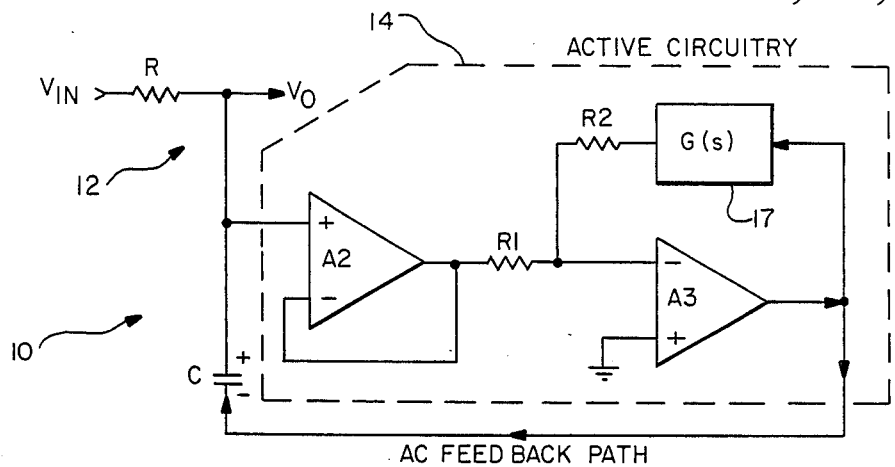
Figure 9:
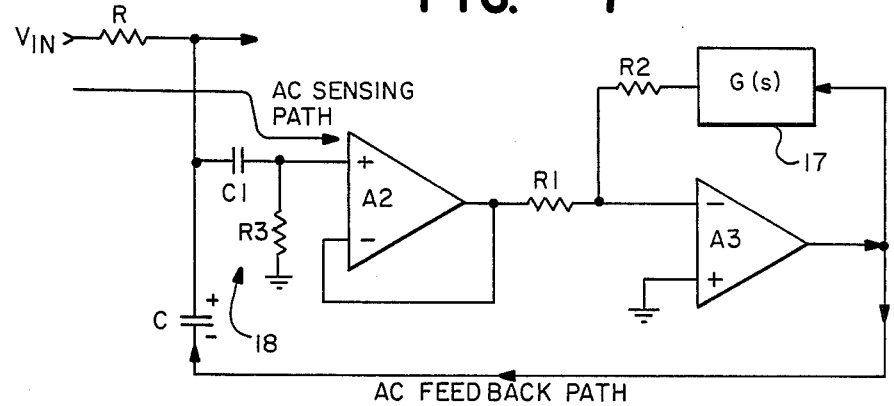
Figure 8:
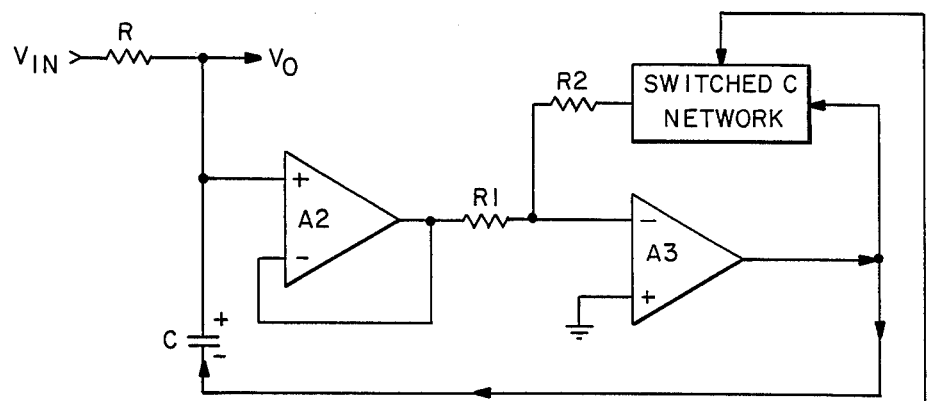

The low pass filter circuit disclosed herein will be described in more detail hereinafter in conjunction with the drawings wherein:

FIG. 1 schematically illustrates a second order low pass filter of the prior art consisting of a pair of parallel RC networks;

FIG. 2 graphically illustrates the output voltage of the circuit illustrated in FIG. 1 as a function of frequency;

FIG. 3 is a prior art low pass filter circuit which combines an RC network with active circuit elements;

FIG. 4 graphically illustrates the output voltage of the circuit illustrated in FIG. 3 as a function of frequency;

FIG. 5 schematically illustrates a low pass filter circuit designed in accordance with the present invention;

FIG. 6 graphically illustrates the output voltage of the circuit illustrated in FIG. 5 as a function of frequency;

FIG. 7 is a more detailed schematic illustration of the low pass filter circuit illustrated in FIG. 5;

FIG. 8 schematically illustrates the circuit shown in FIG. 7 with certain components being displayed in accordance wih their actual working embodiments; and FIG. 9 schematically illustrates a low pass filter circuit which is designed in accordance with a second embodiment of the present invention.

Turning now to the drawings, attention is immediately directed to FIGS. 5 and 6 since FIGS. 1–4 have been discussed previously. As indicated above, FIG. 5 illustrates a low pass filter circuit designed in accordance with the present invention. This circuit which is generally indicated by the reference numeral 10 includes an input terminal $V_{in}$ for receiving an electric signal containing a DC component, high frequency AC components, and possibly low frequency AC components. The circuit also includes a first order pure RC network 12 consisting of a resistor R and capacitor C located between the input terminal $V_{in}$ and an output terminal $V_{out}$. The circuit also includes circuitry generally indicated at 14 having an input terminal $T_{in}$ connected with the output terminal $V_{out}$ and an output terminal $T_o$ connected to the opposite side of capacitor C. The circuit components making up circuitry 14 will be described hereinafter in conjunction with FIGS. 7 and 8. For purpsoes of clarity, this circuitry will be discussed immediately below from a functional standpoint at it relates to two specific aspects of the present invention. For the moment, it suffices only to point out that circuitry 14 has active elements including specifically operational amplifiers having feedback loops including means for defining a particular transfer function.

Still referring to FIG. 5, it should be noted that, according to one aspect of the present invention, circuit 10 does not include a DC current path between the input and output terminals $T_{in}$ and $T_{out}$ of circuitry 14, as contrasted with the low pass filter circuit illustrated in FIG. 3. That is, the output of circuitry 14 and therefore the output of all of its active elements is DC isolated from input and output terminals $V_{in}$ and $V_{out}$ by means of capacitor C. As a result, the DC component of a signal present at $V_{in}$ is immediately passed to $V_{out}$ without being affected in any way by the active elements of circuitry 14. This is to be contrasted with the effect of operational amplifier $A_1$ forming part of the circuit illustrated in FIG. 3 has on the DC component of the signal being filtered by that circuit, as discussed above. Therefore, circuit 10 is DC accurate even though it includes active elements. This is best exemplified in FIG. 6 which, as stated above, graphically illustrates the output voltage $V_o$ as a function of frequency for circuit 10. Note that at zero frequency (the DC component) there is a gain of exactly 1 across the circuit, that is, the amplitude of $V_{out}$ for the DC component will always equal $V_{in}$.

It should be apparent that, without circuitry 14, circuit 10 is merely a first order low pass RC filter. In accordance with a second aspect of the present invention, circuitry 14 continuously senses the signal being filtered, via lead 16 and, responding to that signal, circuitry 14 acts on capacitor C to control the filtering capability of the overall circuit in a particular way which is best illustrated in FIG. 6. Specifically, circuitry 14 acts on capacitor C to maintain unity gain in a predetermined frequency band between input and output signals. Thus, $V_{out}$ is equal $V_{in}$ throughout a low frequency band from a frequency which equals zero to a frequency approaching $F_C$. For frequencies greater than $F_C$, the circuitry 14 acts on the capacitor C to filter out these higher frequency components. Note that the slope defining this roll-off band is relatively steep as compared to the slope of the curve in FIG. 2. The slope of the roll-off of FIG. 6 is $-30$ dB/octave of frequency. For an ideal low pass filter, the slope is of infinite order, that is, it extends vertically as indicated by the dotted line curve of FIG. 2. While it is not possible or practical to provide a roll-off slope of inifinite order, as will be described hereinafter, in an actual working embodiment of the present invention, the components forming circuitry 14 provide for a fifth order roll-off capability which means that the roll-off slope drops 30 decibels/octave. Referring now to FIG. 7, attention is directed to a more detailed illustration of circuit 10. The circuits input and output terminals $V_{in}$ and $V_o$ and its RC network 12 are shown in the same manner as in FIG. 5. However, circuitry 14 which is contained within the dotted box in FIG. 7 is shown including its internal components. These internal components include a buffer amplifier $A_2$ displaying a gain of one so that the voltage $V_o$ appearing at its positive input and also its output. This amplifier serves to isolate the output terminal $V_o$ from the input to the rest of the circuit components making up circuitry 14. The active circuit components making up circuitry 14, that is, the circuit components responsible for providing the filter curve of FIG. 6 includes a second operational amplifier $A_3$, an input resistor $R_1$ and a feedback network across operational amplifier $A_3$ consisting of a resistor $R_2$ in series with means generally indicated at 17 for defining a predetermined transfer function to be described hereinafter. For the moment, it suffices to say that by appropriately selecting the values of resistors $R_1$ and $R_2$ and the transfer function along with the appropriate selection of resistor R and capacitor C making up RC network 12, the output of amplifier $A_3$ will act on the negative side of capacitor C in order to provide the desired filtering pattern, as exemplified in FIG. 6. In accordance with an actual working embodiment of the present invention, overall circuit 10 provides a fifth order filter capability corresponding to the specific filter pattern illustrated in FIG. 6, in which case the high frequency components roll-off at a rate of 30 decibels/octave. In this particular embodiment, the circuit meets the following three conditions:

1. a ratio $R_2/R_1 = 1$.
2. $F_c$ (the cut off frequency - $1.617/2\pi$ RC
3. The normalized to (1 rad/sec) transfer function $G_{(s)}$ defined by means 17 follows the following fourth order polynomial:

$G_s = 2.5210^3/(S^4 + 20.325S^3 + 207.94S^2 + 1.29810^3 S + 2.5210^3)$ with the operator $s=jw$, w being the pulsation of the circuit and expressed in rad/sec. with circuit 10 meeting the three conditions just recited, it will provide low pass filtering capabilities in accordance with the filter pattern illustrated in FIG. 6. Table 2 below illustrates the actual and/or relative values of the resistors and capacitors making up circuit 10 in an actual embodiment. In that embodiment, the amplifiers $A_2$ and $A_3$ are operational amplifiers.

TABLE 2

R follows the relationship $\frac{1}{2\pi RC} = \frac{fc}{1.617}$

C = C1
C1 = C
R1 = R2 = 10K ohms
R2 = R1 = 10K ohms
R3 = 12R

In the actual embodiment just described, the transfer function may be formed by any suitable circuitry. In that particular working embodiment, it is performed by the combination of a readily providable switched capacitor network in combination with a nonoverlapping clock generator which are illustrated in FIG. 8. Otherwise, the circuit shown there is identical to the circuit shown in FIG. 7. Once it is established what the transfer function is to be, one with ordinary skill in the art can readily provide the necessary circuitry, for example the switched capacitor network and non-overlapping clock generator, to carry out that function. However, it is to be understood that the present invention is not limited to the particular transfer function recited above or the filtering pattern illustrated in FIG. 6.

In actual practice, circuit 10 is designed by first selecting a desired filtering pattern such as the one illustrated in FIG. 6. Once the desired pattern is selected along with the values for the RC network and resistors $R_1$ and $R_2$, the transfer function can be approximated mathematically to provide the desired filter pattern. In this regard, note that the particular transfer function recited above is of the fourth order. This in combination with the rest of the circuit including the RC network provides a fifth order filter. If a fourth order filter is contemplated, then a third order transfer function should be derived, and so on. thereafter, suitable circuitry such as the switched capacitor network and clock generator can be provided to approximate the mathematical equation making up the transfer function.

Referring now to FIG. 9, a low pass filter circuit 10' is illustrated. This circuit is identical to circuit 10, with one exception. The circuitry 14 is AC coupled to the RC network 12 by means of circuitry 18. This means that the input to circuitry 14 is isolated from the DC component of the signal being filtered which, in turn, means that the amplitide of the DC component of the signal being filtered can be substantially greater than the rating of the components making up circuitry 14 without damaging these latter components. Otherwise, circuit 10' functions in a manner identical to circuit 10.

What is claimed is:

1. A low pass filter circuit for filtering out high frequency AC components from an electric signal including a DC component and possibly low frequency AC components, said circuit comprising:

(a) first circuit means, free of any active elements, for receiving said signal at an input and passing said entire DC component and any low frequency AC components present in the signal to an output; and (b) second circuit means and means for connecting said second circuit means with said first circuit means, said second circuit means including at least some active components acting on said electric signal for preventing high frequency components of said signal from reaching said output, said second circuit means cooperating with said first circuit means so that the operation of its active elements does not act on the DC component of said signal and therefore does not affect the amplitude of the DC component of the signal as it appears at the output;

(c) said connecting means consisting of means for AC coupling and said second circuit means with said first circuit means for isolating the input of said second circuit means from said DC component, whereby the DC component amplitude can be greater than the ratings of the elements of said second circuit means without damaging the last mentioned elements;

(d) said second means including means for maintaining the amplitude of any low frequency AC components of said signals at said output substantially equal to the amplitude of said DC component while filtering out the high frequency components over a predetermined, relatively narrow roll-off band, said amplitude maintaining means including a feedback network having means including a feedback network having means defining a predetermined transfer function G(s) for providing said predetermined roll-off band, said transfer function being of the fourth order and said roll-off band being of the fifth order.

2. A low pass filter circuit for filtering out high frequency AC components from an electric signal including a DC component and possibly low frequency AC components, said circuit comprising:

(a) input and output terminals;

(b) a low pass RC filter network, free of any active elements, connected between said input and output terminals for receiving said electric signal at said input terminal and passing to said output terminal said entire DC component and any low frequency AC components which are within a predetermined low frequency band and which are present in the signal at the input terminal (c) circuit means and means for connecting said circuit means with said RC network, said circuit means acting on said signal for filtering out said high frequency components over a predetermined, relatively narrow roll-off band, said circuit means cooperating with said RC network so that the operation of its active elements does not act on the DC component of said signal and therefore does not effect the amplitude of the DC component of said signal as it appears at said output terminal;

(d) said connecting means consisting of means for AC coupling said circuit means with said RC network for isolating the input of said circuit means from said DC component, whereby the DC component amplitude can be greater than the rating of the elements of said circuit means without damaging these last mentioned elements;

(e) said circuit means being connected between said RC network and said output terminal and acting on said signal for maintaining the amplitude of said low frequency AC components of said signal at said output substantially equal to the amplitude of said DC component and including an operational amplifier, a feedback loop across said amplifier, said feedback loop including a resistor in series with means defining a predetermined forth order transfer function, whereby to provide a fifth order roll-off band, and an input resistor connected to the input of said operational amplifier.

3. A low pass filter circuit for filtering out high frequency AC components from an electric signal including a DC component and possibly low frequency AC components, said circuit comprising:

(a) first circuit means, free of any active elements, for receiving said signal at an input and passing said entire DC component and any low frequency AC components present in the signal to an output; and (b) second circuit means connected between said first circuit means and said output and including at least some active components acting on said electric signal for preventing high frequency components of said signal from reaching said output, said second circuit means cooperating with said first circuit means so that the operation of its active elements does not act on the DC component of said signal and therefore does not affect the amplitude of the DC component of the signal as it appears at the output, said second means maintaining the amplitude of any low frequency AC components of said signals at said output substantially equal to the amplitude of said DC component while filtering out the high frequency components over a predetermined, relatively narrow roll-off band, and including a feedback network including said active components and having means defining a predetermined transfer function G(s) for providing said predetermined roll-off band, said transfer function being of the fourth order and said roll-off band being of the fifth order, said feedback network including an operational amplifier with feedback circuitry across its input and output and an input resistor $R_1$, said feedback circuitry including said transfer function defining means in series with a second resistor $R_2$.

4. A low pass filter circuit according to claim 3 wherein said first circuit includes a resistor R and capacitor c, wherein said resistors R1 and R2 are equal and wherein said transfer function follows the following equation
$G_s = 2.5210_3/(S^4 + 20.325S^3 + 207.94S^2 + 1.29810^3S + 2.5210^3)$ and the cut off frequency of the circuit follows the following equation $F_c = 1.617/2_\pi$ RC where $S = jw$ and w is the pulsation of the circuit expressed in Rad/sec.

* * * * *

UNITED STATES PATENT AND TRADEMARK OFFICE
CERTIFICATE OF CORRECTION

PATENT NO.  : 4,783,635
DATED       : November 8, 1988
INVENTOR(S) : Nello Sevastopoulos It is certified that error appears in the above—identified patent and that said Letters Patent is hereby corrected as shown below:

Column 1, Line 36, after "$V_{out}=$", delete $[V_{i4}]$ and insert --Vin--.

Figure 2, delete the term [FREG] and insert the term --FREQ--.

In Figure 6, delete the term $[0.044V_{IN}]$ and insert --$0.031V_{IN}$--.

Signed and Sealed this

Second Day of May, 1989

Attest:

DONALD J. QUIGG

Attesting Officer

Commissioner of Patents and Trademarks